US007915693B2

(12) United States Patent
Okano (10) Patent No.: US 7,915,693 B2
(45) Date of Patent: Mar. 29, 2011

(54) SEMICONDUCTOR DEVICE WITH FIN AND SILICIDE STRUCTURE

(75) Inventor: Kimitoshi Okano, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 54 days.

(21) Appl. No.: 12/179,995

(22) Filed: Jul. 25, 2008

(65) Prior Publication Data
US 2009/0026505 A1    Jan. 29, 2009

(30) Foreign Application Priority Data
Jul. 27, 2007   (JP) ................ 2007-196183

(51) Int. Cl.
*H01L 27/088*   (2006.01)
(52) U.S. Cl. .. 257/401; 257/413; 257/329; 257/E29.274
(58) Field of Classification Search .................. 257/329, 257/240, 330, E29.274, E21.619, 401, 413
See application file for complete search history.

(56) References Cited

U.S. PATENT DOCUMENTS

| | | | |
|---|---|---|---|
| 7,129,550 B2 | 10/2006 | Fujiwara et al. | |
| 7,214,576 B1 | 5/2007 | Kaneko et al. | |
| 7,314,787 B2 | 1/2008 | Yagishita | |
| 7,425,500 B2 * | 9/2008 | Metz et al. | 438/607 |
| 7,569,489 B2 * | 8/2009 | Dyer et al. | 438/735 |
| 2006/0166456 A1 | 7/2006 | Fujiwara et al. | |
| 2007/0045736 A1 | 3/2007 | Yagishita | |
| 2007/0075372 A1 * | 4/2007 | Terashima et al. | 257/360 |
| 2007/0241399 A1 * | 10/2007 | Irisawa et al. | 257/347 |
| 2007/0257296 A1 | 11/2007 | Miyano | |
| 2008/0003755 A1 * | 1/2008 | Shah et al. | 438/300 |
| 2008/0121998 A1 * | 5/2008 | Kavalieros et al. | 257/365 |

FOREIGN PATENT DOCUMENTS

| | | |
|---|---|---|
| JP | 2005-86024 | 3/2005 |
| JP | 2005-294789 | 10/2005 |
| JP | 2007-35957 | 2/2007 |
| JP | 2007-73831 | 3/2007 |

OTHER PUBLICATIONS

Jakub Kedzierski, et al., "Extension and Source/Drain Design for High-Performance FinFET Devices", IEEE Transactions on Electron Devices, vol. 50, No. 4, Apr. 2003, pp. 952-958.
A. Kaneko, et al., "Sidewall Transfer and Selective Gate Sidewall Spacer Formation Technology for Sub-15nm FinFET with Elevated Source/Drain Extension", IEEE, 2005, 4 pages.
T. Kanemura, et al., "Improvement of Drive Current in Bulk-FinFET using Full 3D Process/Device Simulations", IEEE, SISPAD, 2006, pp. 131-134, 2006.

* cited by examiner

*Primary Examiner* — Jerome Jackson, Jr.
*Assistant Examiner* — Paul A Budd
(74) *Attorney, Agent, or Firm* — Oblon, Spivak, McClelland, Maier & Neustadt, L.L.P.

(57) ABSTRACT

A semiconductor device according to an embodiment includes: a semiconductor substrate; a fin formed on the semiconductor substrate; a gate electrode formed so as to sandwich both side faces of the fin between its opposite portions via a gate insulating film; an extension layer formed on a region of a side face of the fin, the region being on the both sides of the gate electrode, the extension layer having a plane faced to a surface of the semiconductor substrate at an acute angle; and a silicide layer formed on a surface of the plane faced to the surface of the semiconductor substrate at an acute angle.

5 Claims, 13 Drawing Sheets

SEMICONDUCTOR DEVICE WITH FIN AND SILICIDE STRUCTURE

CROSS-REFERENCE TO RELATED APPLICATIONS

This application is based upon and claims the benefit of priority from prior Japanese Patent Application No. 2007-196183, filed on Jul. 27, 2007, the entire contents of which are incorporated herein by reference.

BACKGROUND OF THE INVENTION

In a fabrication of a fin-type FET (Field Effect Transistor), a technique to form an extension layer by a selective epitaxial growth of a crystal on a surface of a fin so as to reduce parasitic resistance of a source/drain region has been known (for example, disclosed by JP-A 2005-86024).

BRIEF SUMMARY OF THE INVENTION

A semiconductor device according to one embodiment includes: a semiconductor substrate; a fin formed on the semiconductor substrate; a gate electrode formed so as to sandwich both side faces of the fin between its opposite portions via a gate insulating film; an extension layer formed on a region of a side face of the fin, the region being on the both sides of the gate electrode, the extension layer having a plane faced to a surface of the semiconductor substrate at an acute angle; and a silicide layer formed on a surface of the plane faced to the surface of the semiconductor substrate at an acute angle.

A method of fabricating a semiconductor device according to another embodiment includes: forming an insulating film on a semiconductor substrate on which fin is fabricated, so as to cover at least a portion of a side face of the fin; forming a trench having an opening on an upper side thereof in a region of the insulating film by processing the insulating film, the region being adjacent to the fin; forming a gate electrode on the insulating film in which the trench has been formed, so as to sandwich the both sides of the fin between its opposite portions via a gate insulating film; forming an extension layer by epitaxially growing a crystal using a side face of the fin as a base after forming the gate electrode to substantially block off the opening of the trench of the insulating film; lowering the height of the insulating film after forming the extension layer; and forming a silicide layer on a surface of the extension layer after lowering the height of the insulating film.

DETAILED DESCRIPTION OF THE INVENTION

In general, in the fabrication of a fin-type FET, a fin of which the side face is {110} plane is formed on a Si substrate of which principal surface is {100} plane, and often $SiO_2$ is used for an insulating film as an element isolation region. In this case, if an extension layer is formed using a normal vapor phase epitaxial growth technique, a surface with a slow crystal growth rate becomes a facet, and thereby generating a gap between this facet of the extension layer and the element isolation region. Therefore, a material of a gate sidewall or the like formed in a posterior process remains in this gap, which becomes an obstacle when siliciding the extension layer. As a result, a surface of the extension layer to be silicided is only an upper surface and it becomes difficult to reduce parasitic resistance of source/drain regions satisfactory. In addition, even under the condition other than the above, the same problem occurs when a facet is formed on an extension layer.

First Embodiment

Figure 1:
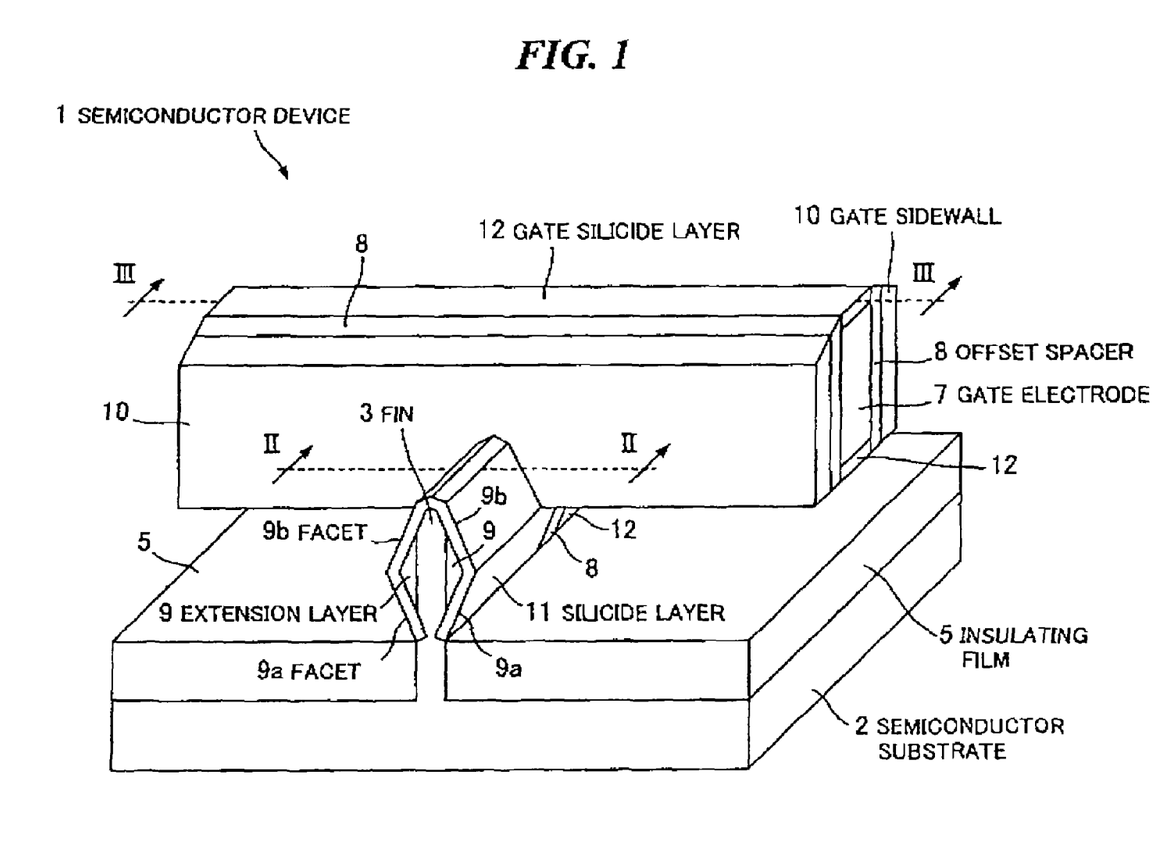
FIG. 1 is a perspective view of a semiconductor device according to a first embodiment.
Figure 2:
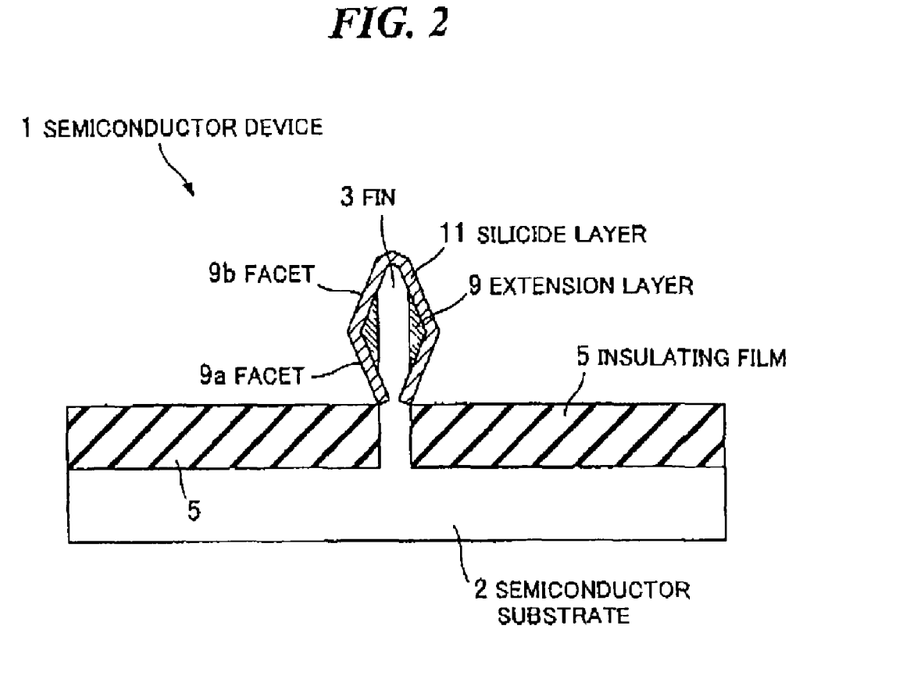
FIG. 2 is a cross sectional view of the semiconductor device according to the first embodiment when a cut surface taken on line II-II of FIG. 1 is viewed in a direction indicated by an arrow in the figure.
Figure 3:
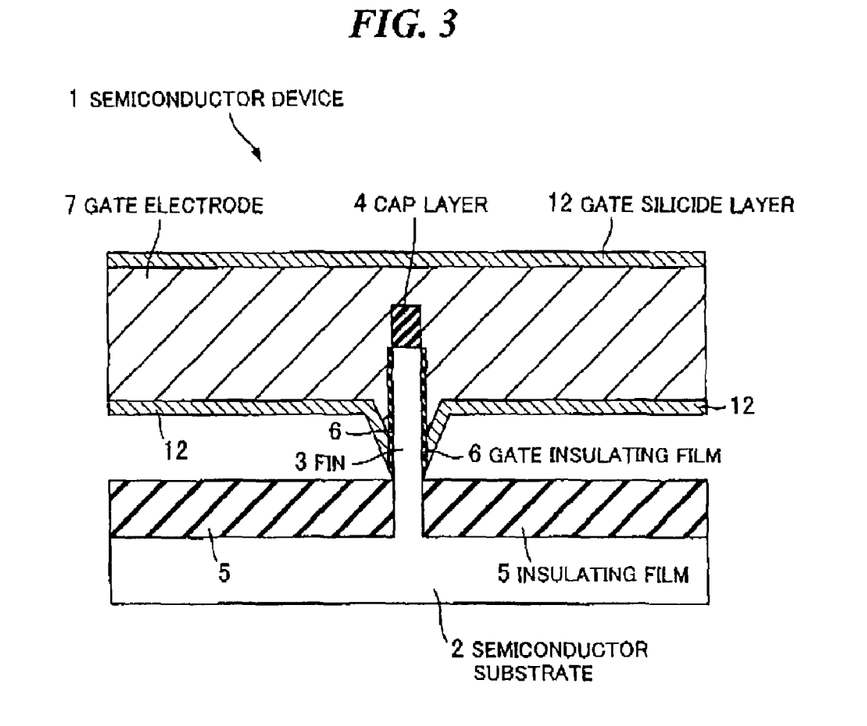
FIG. 3 is a cross sectional view of the semiconductor device according to the first embodiment when a cut surface taken on line III-III of FIG. 1 is viewed in a direction indicated by an arrow in the figure.

FIG. 1 is a perspective view of a semiconductor device according to a first embodiment. Furthermore, FIG. 2 is a cross sectional view when a cut surface taken on line II-II of FIG. 1 is viewed in a direction indicated by an arrow in the figure. Furthermore, FIG. 3 is a cross sectional view when a cut surface taken on line III-III of FIG. 1 is viewed in a direction indicated by an arrow in the figure.

A semiconductor device 1 is schematically configured to have a semiconductor substrate 2, a fin 3 formed on the semiconductor substrate 2, an insulating film 5 having a function as an element isolation region, a gate electrode 7 formed so as to sandwich both side faces of the fin 3 (i.e. both sides of faces of the fin 3) between its opposite portions via a gate insulating film 6, a cap layer 4 formed between an upper surface of the fin 3 and the gate electrode 7, an offset spacer 8 formed on a side face of the gate electrode 7, a gate sidewall 10 formed on a side face of the offset spacer 8, an extension layer 9 formed in a region, within the side faces of the fin 3, which is not sandwiched by opposite portions of the gate electrode 7 and opposite portions of the offset spacer 8, a silicide layer 11 formed on surfaces of the fin 3 and the extension layer 9, and a gate silicide layer 12 formed on upper and lower surfaces of the gate electrode 7.

For the semiconductor substrate 2, it is possible to use a Si substrate or the like of which principal surface is a {100} plane. The {100} plane represents a (100) plane and a plane equivalent to the (100) plane.

The fin 3 is, for example, integrally formed with the semiconductor substrate 2 so that the plane direction of the side plane is {110}. A {110} plane represents a (110) plane and a surface equivalent to the (110) plane. Furthermore, the fin 3 includes a source region and a drain region (not shown). A region in the fin 3 surrounded by the gate electrode 7 and sandwiched by the source region and the drain region functions as a channel region.

The insulating film 5 is composed of, for example, an insulating material such as $SiO_2$ or the like. Furthermore, it is preferable that the insulating film 5 has high etching selectivity against the gate sidewall 10.

The gate insulating film 6 is composed of, for example, $SiO_2$, SiN, SiON, or a high-k material (for example, an Hf-based material such as HfSiON, HfSiO or HfO, a Zr-based material such as ZrSiON, ZrSiO or ZrO, and a Y-based material such as $Y_2O_3$).

The gate electrode 7 is composed of, for example, polycrystalline silicon containing a conductivity type impurity or polycrystalline silicon germanium containing a conductivity type impurity. As for the conductivity type impurity, a p-type impurity species such as B, $BF_2$ or the like is used for a p-type transistor and an n-type impurity species such as As, P or the like is used for an n-type transistor. Furthermore, the gate electrode 7 may be a metal gate electrode composed of W, Ta, Ti, Hf, Zr, Ru, Pt, Ir, Mo, Al or the like, or a compound thereof. When the metal gate electrode is used, the gate silicide layer 12 is not formed. Furthermore, the gate electrode 7 may be composed of fully silicided gate electrode, which is a kind of the metal gate electrode, formed by completely siliciding the polycrystalline silicon containing a conductivity type impurity or the polycrystalline silicon germanium containing a conductivity type impurity. Furthermore, the gate electrode 7 may have a laminated structure in which the polycrystalline silicon containing a conductivity type impurity or the polycrystalline silicon germanium containing a conductivity type impurity is formed on the metal gate electrode. In this case, it is possible to form the gate silicide layer 12 on the polycrystalline silicon containing a conductivity type impurity or the polycrystalline silicon germanium containing a conductivity type impurity.

Furthermore, there is a gap between the gate electrode 7 and the insulating film 5. It is possible to form the gate silicide layer 12 not only on the upper surface of the gate electrode 7, but also on the lower surface of the gate electrode 7 which faces to this gap. The gate silicide layer 12 is composed of, for example, a compound of a metal such as Ni, Pt, Co, Er, Y, Yb, Ti, Pd, NiPt, CoNi or the like, with Si. Also, it is possible to fully silicide the gate electrode 7 by increasing the thickness of the gate silicide layer 12 on the upper and lower surfaces of the gate electrode 7. Furthermore, an insulating member may be provided in the gap between the gate electrode 7 and the insulating film 5.

The cap layer 4 comprises an insulating material having functions as a mask used for RIE (Reactive Ion Etching) to form the fin 3 and as a stopper used for CMP (Chemical Mechanical Polishing) to planarize the insulating film 5 after the film formation thereof, for example, it is possible to use SiN or the like for the insulating material. It may be configured not to provide the cap layer 4 but to provide the gate insulating film 6 on an upper layer of the fin 3, and to form a channel also on the upper surface of the fin 3.

The offset spacer 8 is composed of, for example, $SiO_2$, SiN or the like.

The gate sidewall 10 is composed of, for example, insulating material such as SiN or the like. Furthermore, it may have a structure of two layer made of multiple types of insulating materials comprising SiN, $SiO_2$, TEOS (Tetraethoxysilane) or the like. Furthermore, it may have a structure of three or more layers.

The extension layer 9 is composed of a Si-based crystal such as Si, SiGe, SiC or the like formed by an epitaxial growth method such as a vapor-phase epitaxial growth method, a solid-phase epitaxial growth method or the like. When using a crystal having a lattice constant different from a Si crystal such as a SiGe crystal, a SiC crystal or the like, it is possible to improve carrier mobility by generating a strain in a channel region (not shown) in the fin 3. A crystal, such as the SiC crystal, having a lattice constant smaller than that of the Si crystal to generate an tensile strain in the channel region is used when the semiconductor device 1 is an n-type transistor, and a crystal, such as the SiGe crystal, having a lattice constant larger than that of the Si crystal to generate a compressive strain in the channel region is used when the semiconductor device 1 is a p-type transistor.

Furthermore, the extension layer 9 has a facet 9a, formed on the lower side of the extension layer 9, facing to the surface of the semiconductor substrate 2 or the insulating film 5 at an acute angle. And the extension layer 9 has a facet 9b, formed on the upper side of the extension layer 9, facing to the height direction of the fin 3 and forming an obtuse angle with the surface of the semiconductor substrate 2 or the insulating film 5. Note that, facing to the surface of the semiconductor substrate 2 and the insulating film 5 at an acute angle means that the surface does not face to the height direction of the fin 3 or a direction parallel to the surface of the semiconductor substrate 2, unlike the facet 9b. The facets 9a and 9b are plane, appeared in an epitaxial growth process of a crystal, of which crystal growth rate is slow, for example, they are {111} planes of the crystal which configures the extension layer 9. Note that, the {111} plane represents a (111) plane and a plane equivalent to the (111) plane.

The silicide layer 11 is composed of, for example, a compound of a metal such as Ni, Pt, Co, Er, Y, Yb, Ti, Pd, NiPt, CoNi or the like with Si, and is formed on surfaces of the fin 3 and the extension layer 9 which include the facets 9a and 9b.

An example of a method of fabricating a semiconductor device 1 according to this embodiment will be described hereinafter.

FIGS. 4A to 4K are perspective views showing processes for fabricating the semiconductor device according to the first embodiment.

Figure 4A:
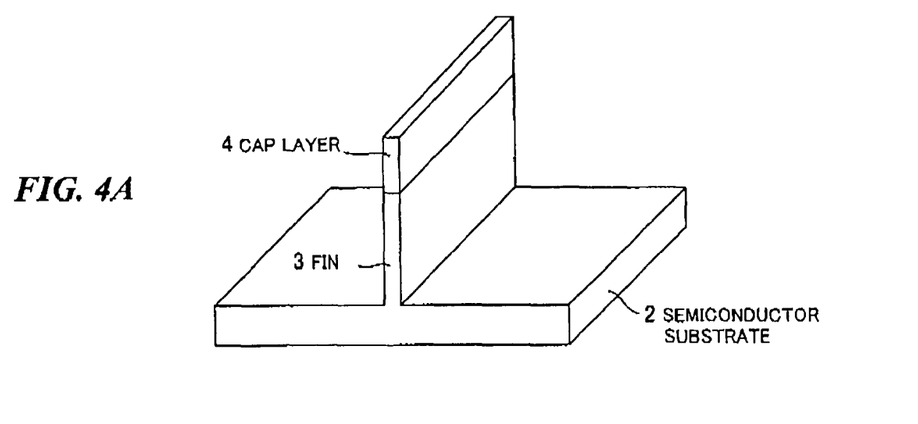
FIGS. 4A to 4K are perspective views showing processes for fabricating the semiconductor device according to the first embodiment.

Firstly, as shown in FIG. 4A, after forming a material film of the cap layer 4 on the semiconductor substrate 2, for example, the semiconductor substrate 2 and the material film of the cap layer 4 are patterned by a photolithographic method and RIE, then, the fin 3 having the cap layer 4 on the upper surface thereof is formed.

Figure 4B:
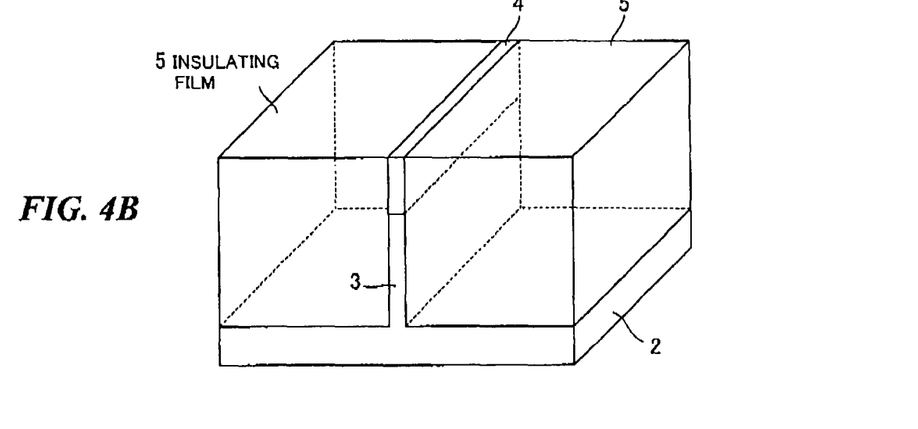

Next, as shown in FIG. 4B, after depositing the insulating film 5 on the semiconductor substrate 2 higher than the height of the upper surface of the cap layer 4 by a CVD (Chemical Vapor Deposition) method or the like, planarizing treatment such as CMP or the like is applied to this insulating film 5 using the upper surface of the cap layer 4 as a stopper.

Figure 4C:
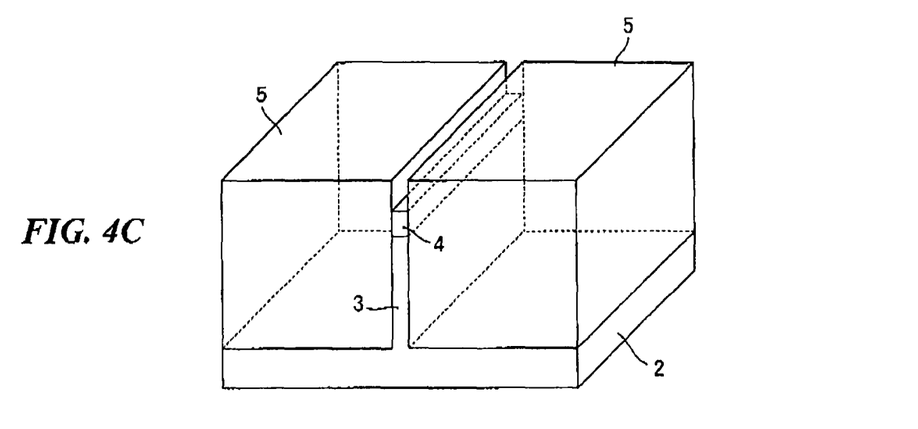

Next, as shown in FIG. 4C, the etching is selectively applied to the cap layer 4 and the height of the cap layer 4 is lowered to a predetermined height. For example, when a cap layer comprises a SiN film and an insulating layer comprises a $SiO_2$ film, it is possible to selectively carry out etch back only to the cap layer 4 by wet etching using a hot phosphoric acid. Here, the area of an exposed side face of the insulating film 5 facing to the side face of the cap layer 4 is adjusted by adjusting the height of the cap layer 4.

Figure 4D:
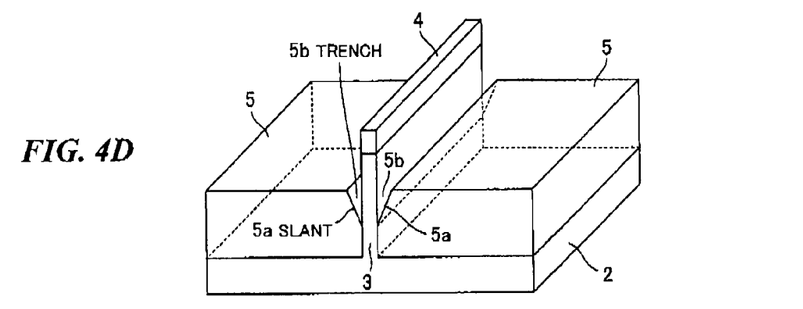

Next, as shown in FIG. 4D, the insulating film 5 is etched back. For example, when the cap layer comprises a SiN film and an insulating layer comprises a $SiO_2$ film, it is possible to selectively etch back only the insulating film 5 by wet etching using a hydrofluoric acid.

The insulating film 5 etched back has a slant 5a forming a trench 5b in a portion from the upper surface of a region adjacent to the fin 3 of the insulating films to a predetermined depth. An angle of this slant 5a is determined by the area of the exposed side face of the insulating film 5 adjusted in a process to etch back to the cap layer 4 shown in FIG. 4C. This is because the etching progresses also from the exposed side face of the insulating film 5 when etching back the insulating film 5. The greater the exposed side face area of the insulating film 5, the larger the angle of the slant 5a. Note that, it is preferable that the angle of the slant 5a is formed so as to match an angle of the facet 9a of the extension layer 9 which is formed in the posterior process. The slant 5a is not limited to a linear slant. It is preferable to etch back to the insulating film 5 until the upper surface thereof is positioned below the upper surface of the fin 3 in order to provide an enough size for the trench 5b.

Furthermore, there is a following method as another method to form a slant 5a on the insulating film 5. After a process to apply planarizing treatment to the insulating film 5 shown in FIG. 4B. When etching back to the insulating film 5 by the RIE without implementing a process to lower the height of the cap layer 4 shown in FIG. 4C, a trench 5b is naturally formed in a region adjacent to the fin 3 of the insulating film 5 and it is possible to process the insulating film 5 to be in a shape shown in FIG. 4D.

Figure 4E:
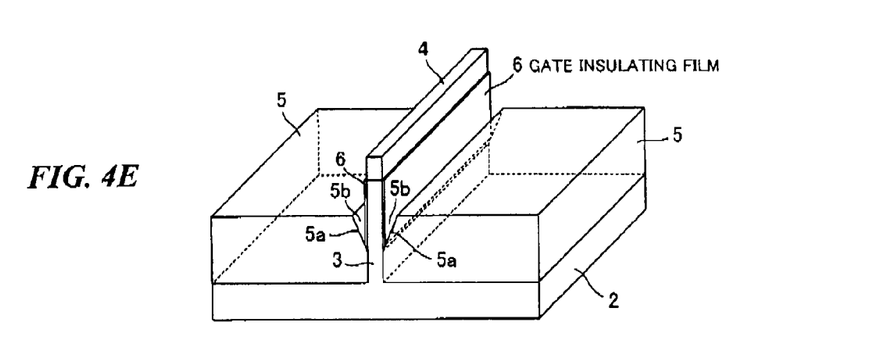

Next, as shown in FIG. 4E, the gate insulating film 6 is formed on the side face of the exposed fin 3. For example, the gate insulating film 6 is formed by applying oxidation treatment to the side face of the fin 3 in case of using a $SiO_2$ film as a gate insulating film 6, and by applying nitriding treatment or oxynitriding treatment after applying oxidation treatment to the side face of the fin 3 in case of using a SiON film. Furthermore, when using a SiN film, a high-k material film or the like as the gate insulating film 6, after depositing the SiN film, the high-k material film or the like on the whole surface of the semiconductor substrate 2 by the CVD method or the like, the gate insulating film 6 may be formed by removing an unnecessary portion of such film.

Figure 4F:
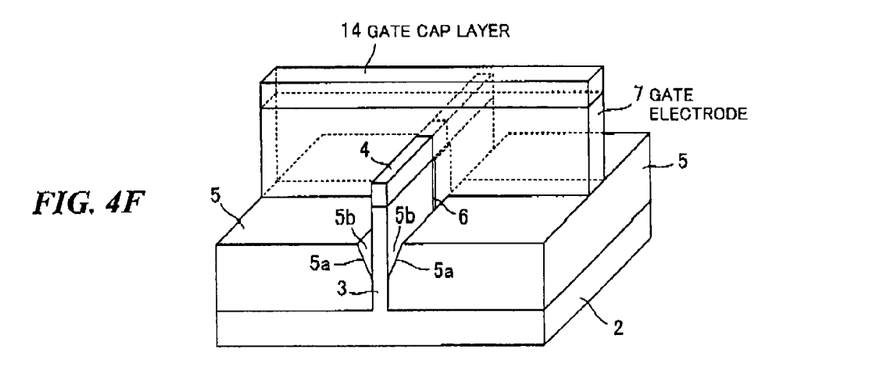

Next, as shown in FIG. 4F, a gate electrode 7 having a gate cap layer 14 on the upper surface of thereof is formed and a portion which does not contact with the gate electrode 7 of the gate insulating film 6 is removed.

The formation of the gate electrode 7 and the gate cap layer 14 and the process of the gate insulating film 6 are carried out by, for example, following process. Firstly, a material film of the gate electrode 7 such as a polycrystalline silicon film is deposited on the semiconductor substrate 2 using the CVD method or the like, and is planarized by the CMP or the like. Next, a material film of the gate cap layer 14 such as SiN, $SiO_2$ or the like is deposited on the planarized material film of the gate electrode 7. Next, the gate electrode 7 and the gate cap layer 14 are formed and the gate insulating film 6 is processed by patterning the material film of the gate electrode 7, the material film of the gate cap layer 14 and the gate insulating film 6 using, for example, the photolithographic technique and the RIE method.

Figure 4G:
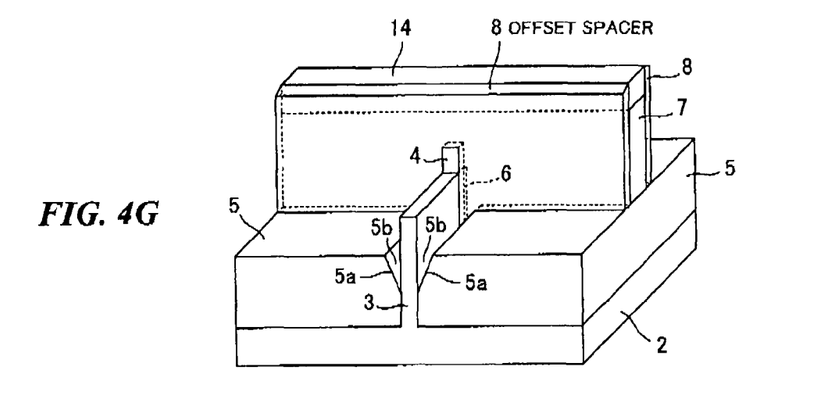

Next, as shown in FIG. 4G, the offset spacer 8 is formed on each of the side faces of the gate electrode 7 and the gate cap layer 14.

The formation of the offset spacer 8 is carried out by, for example, following process. Firstly, a material film of the offset spacer 8 is deposited on the semiconductor substrate 2 using the CVD method or the like. Next, the material film of the offset spacer 8 is processed by applying anisotropic etching process, which results in that the offset spacer 8 are formed on each of the side faces of the gate electrode 7 and the gate cap layer 14. At this time, it is possible to form the offset spacer 8 on each of the side faces of the gate electrode 7 and the gate cap layer 14 while completely removing the material film of the offset spacer 8 on the side face of the fin 3 by adjusting the etching condition. Note that a portion, of cap layer 4, which is not surrounded by the gate electrode 7 and the offset spacer B is removed at the same time when processing the offset spacer 8.

Then, conductivity type impurity is implanted to both side faces of the fin 3 by an ion implantation procedure, a plasma doping method or the like at a predetermined angle from a vertical direction using the offset spacer 8 as a mask edge, which results in that an extension region (not shown) of the source/drain region is formed. After that, the conductivity type impurity in the extension region is activated by annealing.

Figure 4H:
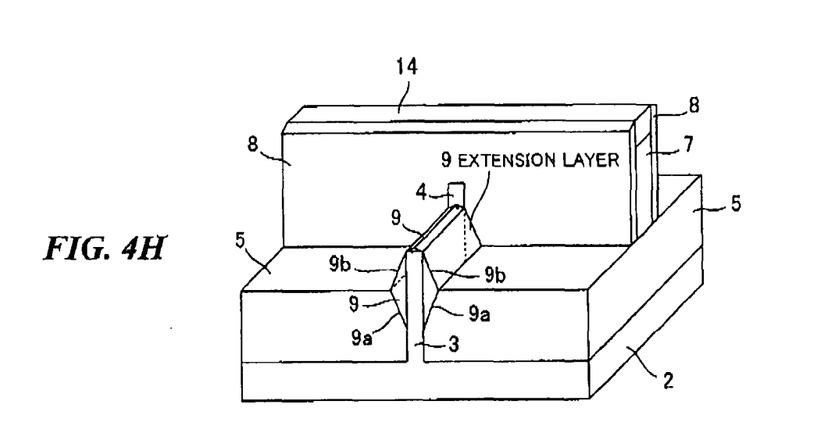

Next, as shown in FIG. 4H, a crystal is grown by an epitaxial growth method using an exposed surface of the fin 3 as a base, which results in that the extension layer 9 is formed. At this time, the facet 9a of the extension layer 9 substantially matches the slant 5a of the insulating film 5, and the trench 5b is embedded by the extension layer 9. Even if the facet 9a does not completely match the slant 5a of the insulating film 5, it is acceptable if the extension layer 9 is formed so as to substantially block off an opening on the upper side of the trench 5b and a material film of the gate sidewall 10 does not substantially enter into the gap. Here, substantially blocking off the opening means to prevent the material film of the gate sidewall 10 from being formed in the gap under the facet 9a in the posterior process, or to be able to remove easily due to the very small amount even if it is formed, concretely, following cases are considered.

Figures 5A, 5B:
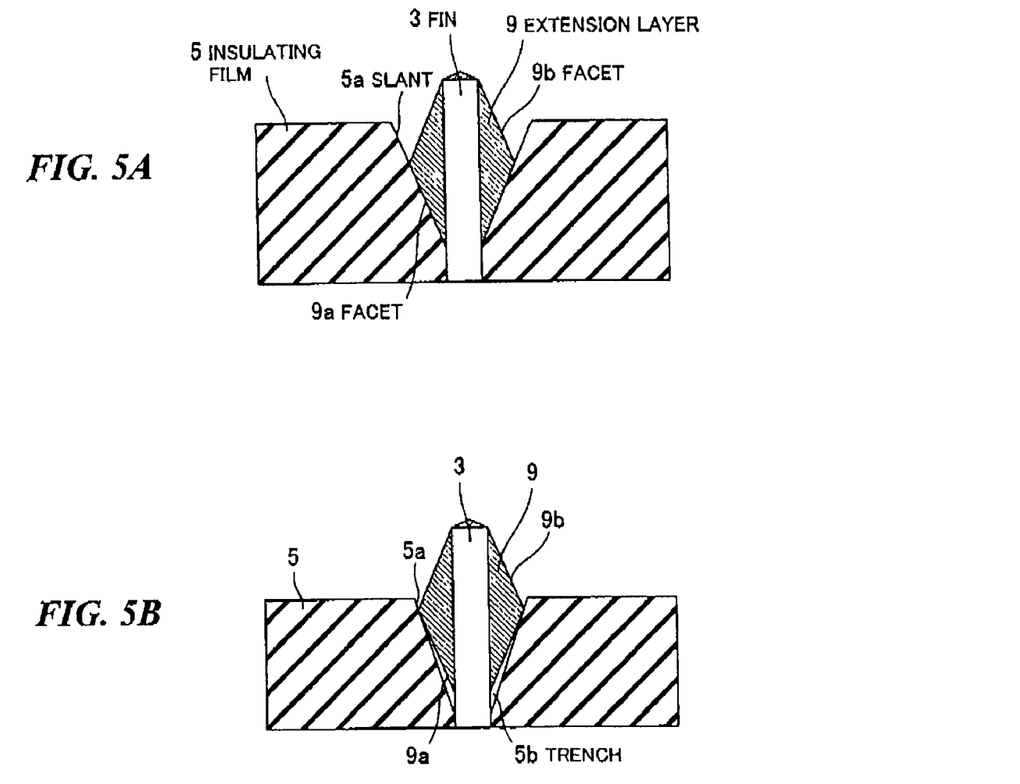
FIGS. 5A to 5C are partial cross sectional views showing processes for fabricating the semiconductor device according to the first embodiment.

As shown in FIG. 5A, following is an explanation of the case that the height of the top edge of the slant 5a is different from that of the facet 9a even though the angle of the slant 5a and the facet 9a matches. As shown in FIG. 5A, when the height of the top edge of the slant 5a is higher than that of the facet 9a, a material film of the gate sidewall 10 or another unwanted material does not substantially enter into the gap since the facet 9a contacts with the slant 5a and any gap is not formed between them. On the other hand, when the height of the top edge of the slant 5a is lower than that of the facet 9a, although a gap is generated between an exposed portion of the facet 9a and the insulating film 5, it is acceptable as long as a material of the gate sidewall 10 does not remain in the gap in the posterior process.

Furthermore, following is an explanation of the case that an angle with respect to the surface of the semiconductor substrate 2 of the slant 5a is larger than that of the facet 9a as shown in FIG. 5B. In this case, although the trench 5b remains between the facet 9a and the insulating film 5, a material film of the gate sidewall 10 or another unwanted material does not substantially enter into the gap since the top edge of the facet 9a contacts with the insulating film 5 and the top edge of the trench 5b is closed, and thereby not remaining the material of the gate sidewall 10 in the trench 5b in the posterior process. Even if the top edge of the trench 5b is not completely closed, it is acceptable as long as it is possible to substantially prevent the gate sidewall 10 from entering in the trench 5b in the posterior process. Furthermore, when the height of the top edge of the slant 5a is lower than that of the facet 9a, although a gap is generated between the exposed portion of the facet 9a and the insulating film 5, it is acceptable as long as the material of the gate sidewall 10 does not remain in the gap in the posterior process.

Figure 5C:
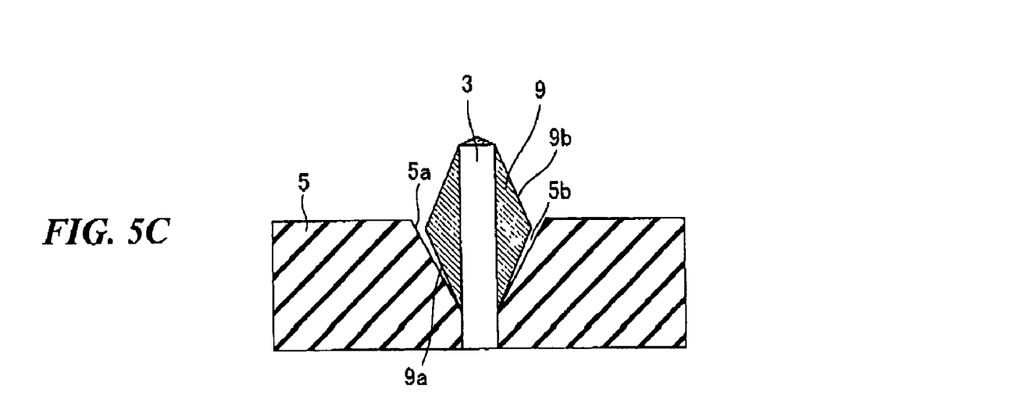

Furthermore, following is an explanation of the case that an angle with respect to the surface of the semiconductor substrate 2 of the slant 5a is smaller than that of the facet 9a as shown in FIG. 5C. In this case, the trench 5b opened on the upper side thereof remains between the facet 9a and the insulating film 5 regardless of the height of the top edge of the slant 5a. However, in this case, it is also acceptable as long as the gap is in a size that the material of the gate sidewall 10 does not substantially enter thereto in the posterior process.

Figure 4I:
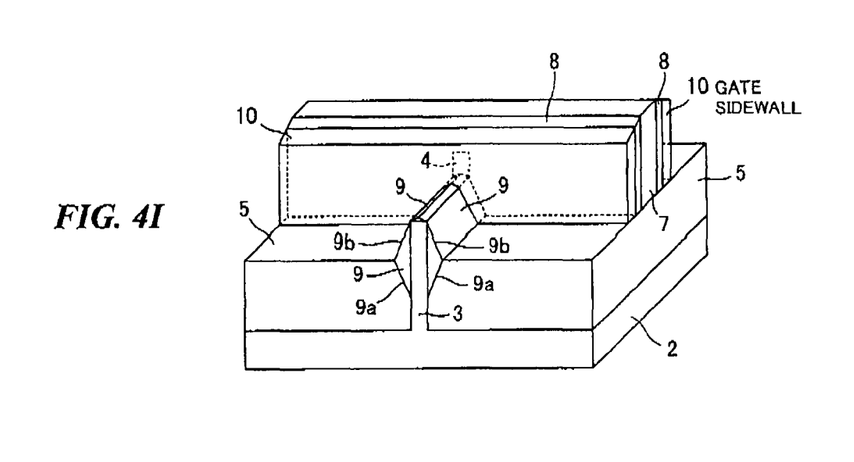

Next, as shown in FIG. 4I, the gate sidewall 10 is formed on the side face of the offset spacer B.

For example, the gate sidewall 10 is formed in the following processes. Firstly, a material film of the gate sidewall 10 is deposited on the semiconductor substrate 2 using the CVD method or the like. Next, the gate sidewall 10 is formed on the side face of the offset spacer 8 by applying anisotropic etching to the material film of the gate sidewall 10. Here, since the facet 9a of the extension layer 9 is covered by the insulating film 5, the material film of the gate sidewall 10 is not formed under the facet 9a when processing the material film of the gate sidewall 10, or, even though it is formed slightly, it does not remain since it is possible to remove easily when processing the gate sidewall 10.

Note that, a crystal is grown by an epitaxial growth method using a surface of the extension layer 9 as a base after forming the gate sidewall 10, which results in that the volume of the extension layer 9 may be increased. At this time, a crystal different from the extension layer 9 to be a base may be grown. For example, it is possible to grow a SiGe crystal, a SiC crystal or the like on the surface of the extension layer 9 comprising a Si crystal.

Figure 4J:
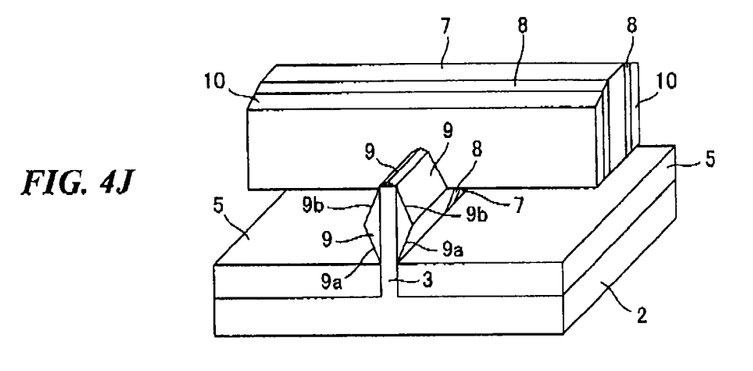

Next, as shown in FIG. 4J, etch back for the insulating film 5 is carried out by wet etching so as to expose the facet 9a of the extension layer 9. At this time, the insulating film 5 under the gate electrode 7 may be remained, however, it is possible to form a gap under the gate electrode 7 and silicide the lower surface of the gate electrode 7 by removing the insulating film 5. Furthermore, since the etching selectivity of the insulating film 5 and the gate sidewall 10 is large, the gate sidewall 10 is hardly etched when carrying out etch back of the insulating film 5.

Note that, after exposing the facet 9a by etching back to the insulating film 5, a crystal is grown by an epitaxial growth method using a surface of the extension layer 9 as a base, which results in that the volume of the extension layer 9 may be increased. At this time, a crystal different from the extension layer 9 to be a base may be grown. For example, it is possible to grow a SiGe crystal, a SiC crystal or the like on the surface of the extension layer 9 comprising a Si crystal.

Then, conductivity type impurity is implanted to both side faces of the fin 3 having the extension layer 9 by an ion implantation procedure at a predetermined angle from a vertical direction using the gate sidewall 10 as a mask edge, which results in that a source/drain region (not shown) is formed. After that, the conductivity type impurity in the source/drain region is activated by annealing.

Figure 4K:
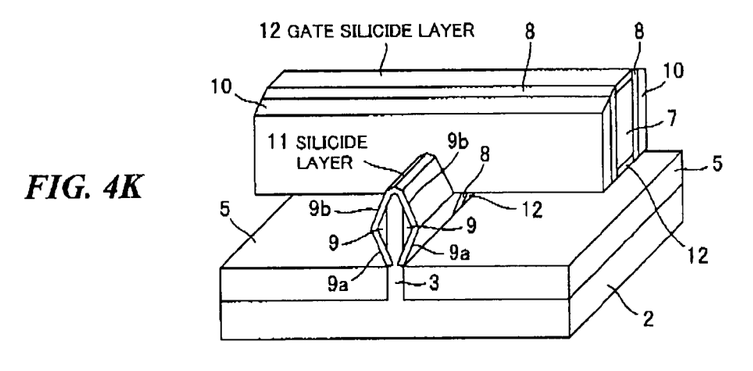

Next, as shown in FIG. 4K, the fin 3 having the extension layer 9 on the surface thereof and the upper and lower surfaces of the gate electrode 7 are silicided to form the silicide layer 11 and the gate silicide layer 12, respectively. Both of the facets 9a and 9B of the extension layer 9 are silicided.

Here, for example, a metal film composed of Ni or the like is deposited by the CVD, ALD (Atomic Layer Deposition) or the like so as to cover the surface of the fin 3 having the extension layer 9 on the surface thereof and the upper and lower surfaces of the gate electrode 7, and silicidation reaction is generated on an interface between the metal film and the upper surface of the fin 3 having the extension layer 9 on the surface thereof and an interface between the metal film and the upper and lower surfaces of the gate electrode 7 by RTA (Rapid Thermal Annealing) at 400-500° C., which results in that the silicide layer 11 and the gate silicide layer 12 are formed. Note that an unreacted portion of the metal film is removed by etching with a mixed solution of sulfuric acid and hydrogen peroxide solution.

After this, it is possible to physically support the gate electrode 7 by embedding an insulating member in the gap between the gate electrode 7 and the insulating film 5.

According to the first embodiment, it is possible to prevent the material of the gate sidewall 10 from remaining in the gap under the facet 9a and to perform silicidation of the facet 9a. As a result, compared with a conventional method in which it is not possible to silicide the facet 9a, since it is possible to increase a region to be silicided, it is possible to sufficiently reduce parasitic resistance.

Furthermore, it is possible to perform silicidation not only to the upper surface of the gate electrode 7 but also the lower surface by removing the insulating film 5 under the gate electrode 7, forming a gap between the gate electrode 7 and the insulating film 5, and exposing the lower surface of the gate electrode 7. As a result, it is possible to reduce electrical resistance of the gate electrode 7 more effectively.

Furthermore, it is also possible to perform full silicidation of the gate electrode 7 by increasing the thickness of the gate silicide layer 12 on the upper and lower surfaces of the gate electrode 7. In this case, compared with a usual method in which the silicidation reaction progresses only from the upper surface, it is possible to improve uniformity in a depth direction of a composition of the silicide in the gate electrode 7 since the silicidation reaction progresses from the upper and lower surfaces of the gate electrode 7, thus, it is possible to reduce dispersion of threshold voltage of the transistor caused by nonuniformity of the composition.

Furthermore, when an insulating member is embedded in a gap between the gate electrode 7 and the insulating film 5, since the thickness of an insulating film between a gate electrode and a semiconductor substrate with respect to the height of a fin is larger compared with a conventional structure, it is possible to reduce parasitic capacitance between the gate electrode and the semiconductor substrate.

Furthermore, the area of the gate electrode faced to a source/drain contact becomes smaller than that of the conventional structure due to the shape of the gate electrode 7 of this embodiment, thus, it is possible to reduce parasitic capacitance between the gate electrode and the source/drain contact.

Second Embodiment

The semiconductor device 1 according to the second embodiment has a structure in which a strain generating film having a function to generate a strain in a channel region is added to the semiconductor device 1 according to the first embodiment. Note that, as for a configuration of other members, a fabrication process or the like which are same as the first embodiment, the explanation will be omitted to simplify.

Figure 6:
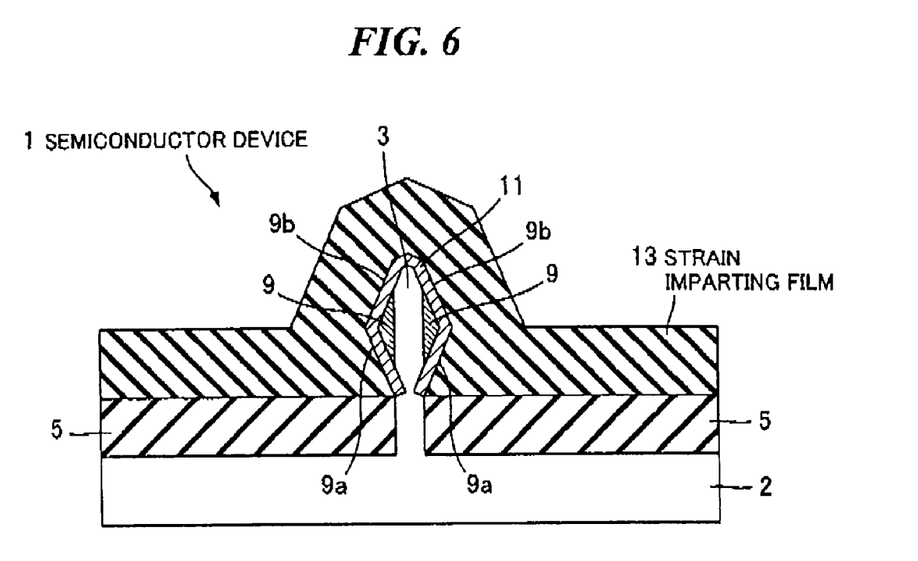
FIG. 6 is a cross sectional view of a semiconductor device according to a second embodiment.
Figure 7:
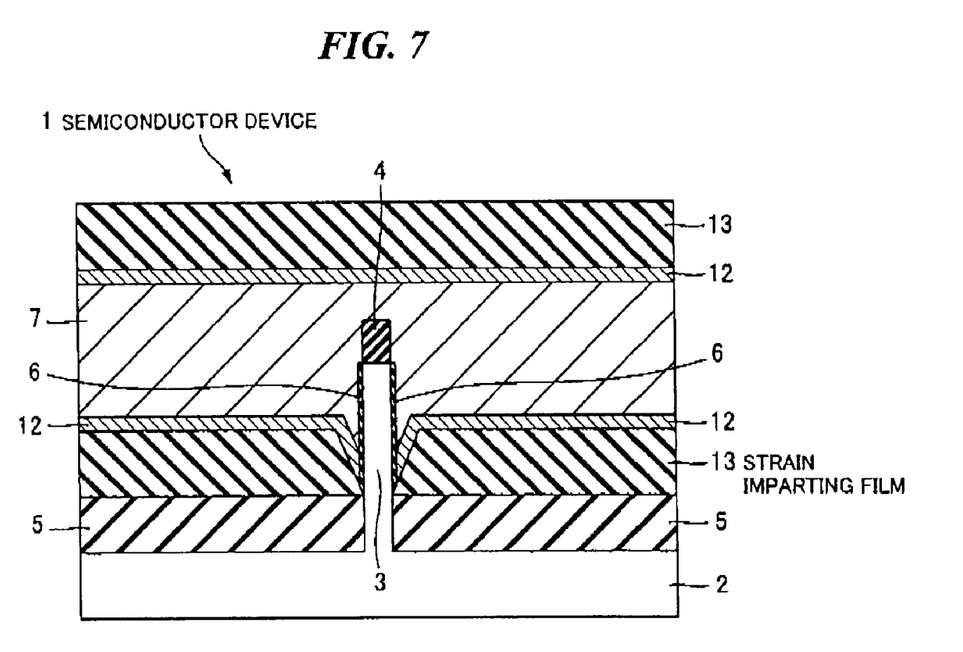
FIG. 7 is a cross sectional view of the semiconductor device according to the second embodiment.

FIG. 6 and FIG. 7 are cross sectional views of the semiconductor device according to the second embodiment. The cross sections shown in FIG. 6 and FIG. 7 correspond to the cross sections of the semiconductor device 1 according to the first embodiment shown in FIG. 2 and FIG. 3, respectively.

As shown in FIG. 6 and FIG. 7, a strain generating film 13 is formed on the whole surface of the semiconductor device 1. The strain generating film 13 is also formed in a gap between the gate electrode 7 and the insulating film 5 under the gate electrode 7.

The strain generating film 13 has a function to improve carrier mobility by generating a strain in a channel region (not shown) in the fin 3. It is formed as a film to generate a tensile strain in the channel region when the semiconductor device 1 is an n-type transistor, and formed as a film to generate a compressive strain in the channel region when the semiconductor device 1 is a p-type transistor.

For the strain generating film 13, it is possible to use a SiN film formed by the CVD method or the like. In this case, it is possible to form a film to generate a compressive strain and a film to generate a tensile strain separately by controlling hydrogen concentration in the SiN film.

Furthermore, the strain generating film 13 can be used as an etching stopper when etching an interlayer insulating film (not shown) formed on the strain generating film 13 to form a contact plug (not shown). Furthermore, the strain generating film 13 is formed on the whole surface of the semiconductor device 1 by the CVD method or the like, after carrying out the processes for forming the silicide layer 11 and the gate silicide layer 12 in the same way as the first embodiment as shown in FIGS. 4A to 4K.

According to the second embodiment, a strain is generated in the channel region more effectively by forming the strain generating film 13 also in a gap between the gate electrode 7 and the generating film 5 under the gate electrode 7, which makes it possible to improve carrier mobility.

Third Embodiment

The third embodiment is different from the first embodiment in a method of fabricating the semiconductor device 1. Note that, as for the process same as the first embodiment, the explain will be omitted to simplify.

FIGS. 8A to 8F are cross sectional views showing processes for fabricating a semiconductor device according to a third embodiment. The cross sections shown in FIGS. 8A to 8F correspond to the cross sections of the semiconductor device 1 according to the first embodiment shown in FIG. 2.

Firstly, the process to form the fin 3 having the cap layer 4 on the upper surface thereof shown in FIG. 4A is carried out in the same way as the first embodiment.

Next, as shown in FIG. 5A, the insulating film 5 is deposited on the semiconductor substrate 2 higher than the height of the upper surface of the cap layer 4 by the CVD method or the like.

Figure 8A:
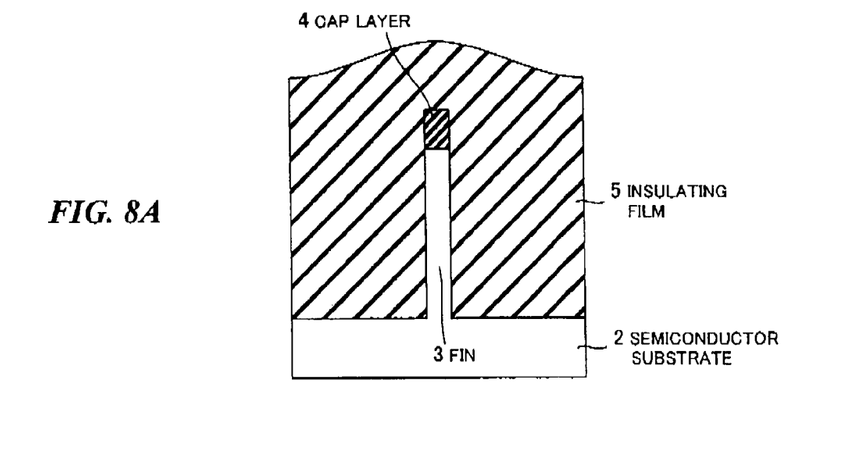
FIGS. 8A to 8F are cross sectional views showing processes for fabricating a semiconductor device according to a third embodiment.
Figure 8B:
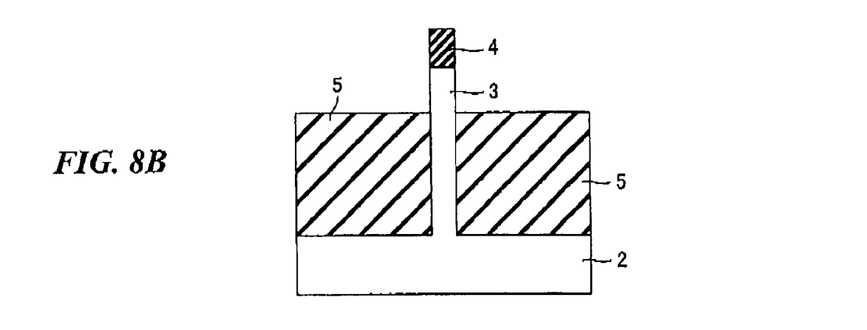

Next, as shown in FIG. 8B, the insulating film 5 is etched back up to a predetermined height.

Figure 8C:
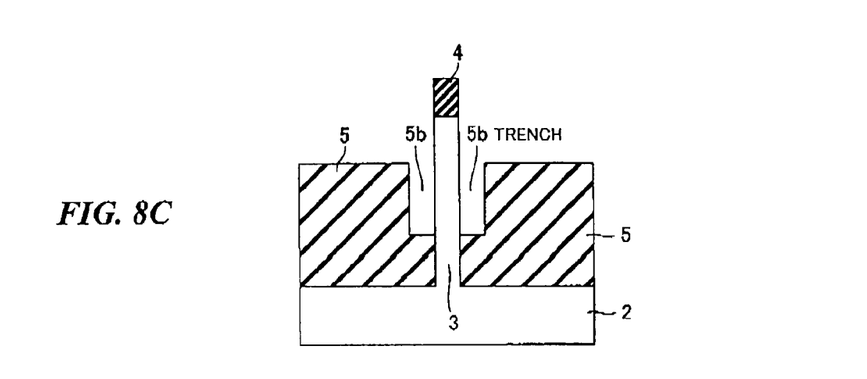

Next, as shown in FIG. 8C, a region adjacent to the fin 3 of the insulating film 5 is selectively etched by, for example, the photolithographic method and the RIE, which results in that the trench 5b having an opening on the upper side thereof is formed.

The trench 5b in the insulating film 5 in a cross sectional view has a rectangular shape in FIG. 8C. However, other shapes may be available.

Following this, a process to form the gate insulating film 6 shown in FIG. 4E, a process to form the gate electrode 7 and to remove a portion which does not contact with the gate electrode 7 of the gate insulating film 6 shown in FIG. 4F, a process to form the offset spacer 8 and a process to form an extension region of the source/drain region shown in FIG. 4G, are carried out in the same way as the first embodiment.

Figure 8D:
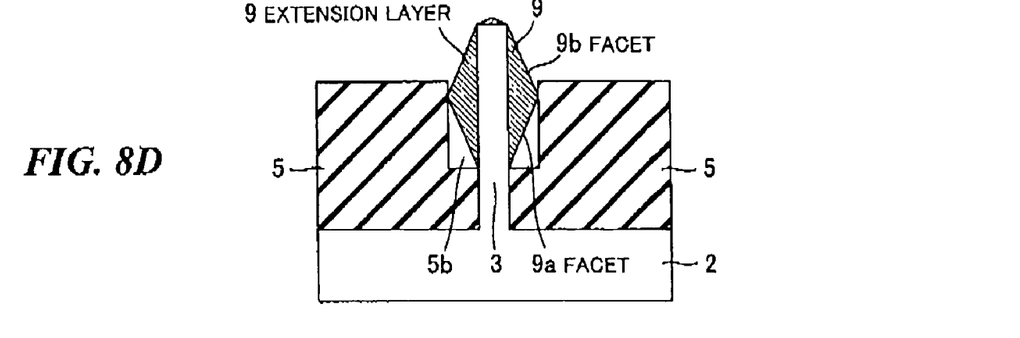

Next, as shown in FIG. 8D, a crystal is grown by the epitaxial growth method using the exposed surface of the fin 3 as a base, which results in the formation of the extension layer 9. At this time, a top edge of the extension layer 9 (in case that the cross section is a triangle and the base of the triangle contacts with the side face of the fin 3 as shown in FIG. 8D, a vertex thereof) in a growth direction of the extension layer 9 grown from the side face of the fin 3 contacts with the side face of the trench 5b and the opening of the trench 5b is blocked off. Note that, the extension layer 9 does not necessarily contact with the side face of the trench 5b if the material film of the gate sidewall 10 does not substantially enter into the gap under the facet 9a in the posterior process.

Following this, a process to form the gate sidewall 10 shown in FIG. 4I is carried out in the same way as the first embodiment.

Figure 8E:
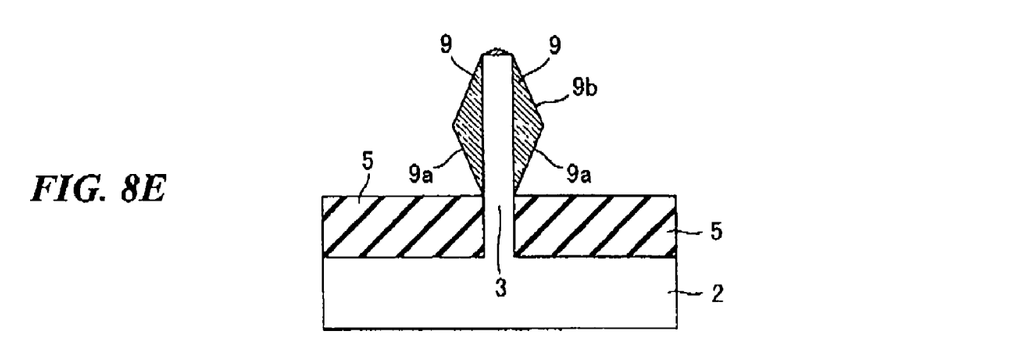

Next, as shown in FIG. 8E, the facet 9a of the extension layer 9 is exposed by etching back a region, of the insulating film 5, where the trench 5b is not formed.

Following this, a process to form the source/drain region is carried out in the same way as the first embodiment.

Figure 8F:
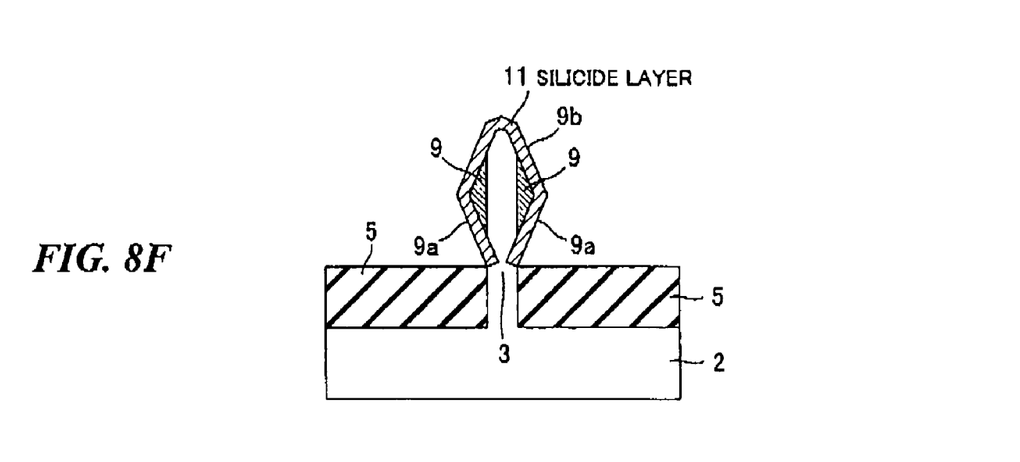
Figure 9:
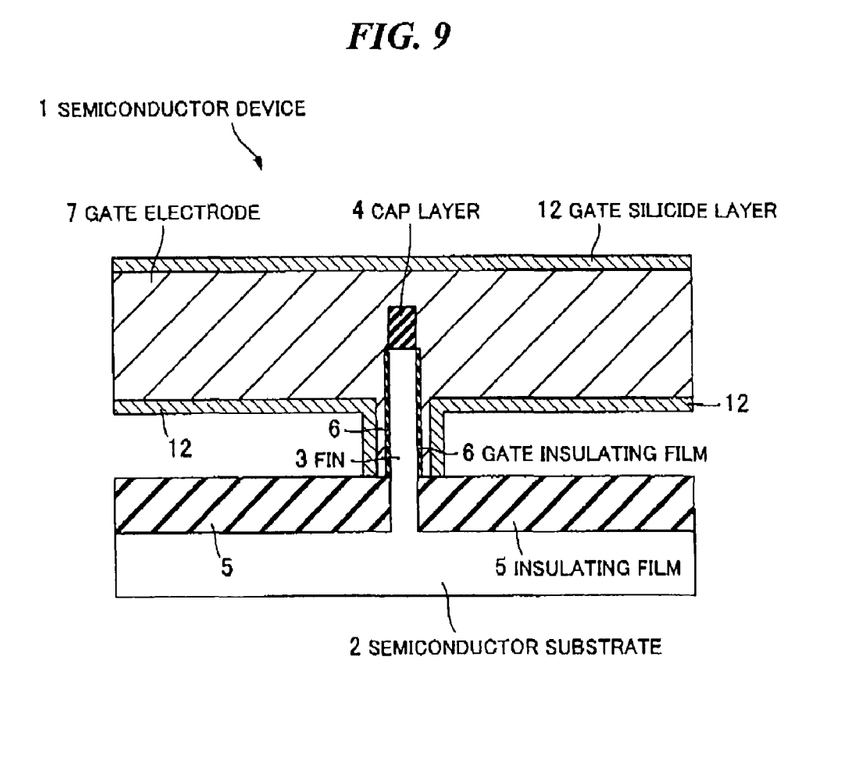
FIG. 9 is a cross sectional view of the semiconductor device according to the third embodiment.

Next, as shown in FIG. 8F, the silicide layer 11 and the gate silicide layer 12 are formed respectively by siliciding the fin 3 having the extension layer 9 on the front surface thereof and the upper and lower surfaces of the gate electrode 7. Both of the facets 9a and 9b of the extension layer 9 are silicided. FIG. 9 is a cross sectional view showing a cross section corresponding to the cross section shown in FIG. 3.

After this, it is possible to embed an insulating member to physically support the gate electrode 7 and the strain generating film 13 according to the second embodiment in the gap between the gate electrode 7 and the insulating film 5.

According to the third embodiment, the material of the gate sidewall 10 is prevented from remaining in the gap under the facet 9a by using a method different from the first embodiment, which makes it possible to silicide the facet 9a.

Other Embodiments

It should be noted that the present invention is not intended to be limited to the above-mentioned first to third embodiments, and the various kinds of changes thereof can be implemented by those skilled in the art without departing from the gist of the invention.

For example, in each of the above-mentioned first to third embodiments, although the extension layer 9 has the facets 9a and 9b and is in a shape of which cross section is a triangle, it is not limited to such shape in fact. For example, the extension layer 9 may has the facets 9a and 9b, and a surface parallel to the side face of the fin 3 and be in a shape of which cross section is a trapezoid.

What is claimed is:

1. A semiconductor device, comprising:
a semiconductor substrate;
a fin formed on the semiconductor substrate;
a gate electrode formed so as to sandwich both side faces of the fin between its opposite portions via a gate insulating film;
an extension layer formed on a region of a side face of the fin, the region being on the both sides of the gate electrode, the extension layer having a plane faced to a surface of the semiconductor substrate at an acute angle;
a silicide layer formed on a surface of the plane faced to the surface of the semiconductor substrate at an acute angle; and
a gate silicide layer on upper and lower surfaces of the gate electrode.

2. A semiconductor device according to claim 1, wherein a strain generating film to generate a strain in a region of the fin is formed under the gate electrode, the region being sandwiched by opposite portions of the gate electrode.

3. A semiconductor device according to claim 1, wherein the extension layer comprises a Si-based crystal.

4. A semiconductor device according to claim 1, wherein the plane faced to the surface of the semiconductor substrate at an acute angle is a facet of which plane direction is {111}.

5. A semiconductor device according to claim 1, wherein the extension layer has a plane facing to a height direction of the fin and forming an obtuse angle with a surface of the semiconductor substrate.

* * * * *